United States Patent
Stembridge et al.

(10) Patent No.: US 7,940,549 B2
(45) Date of Patent: May 10, 2011

(54) DRAM POSITIVE WORDLINE VOLTAGE COMPENSATION DEVICE FOR ARRAY DEVICE THRESHOLD VOLTAGE AND VOLTAGE COMPENSATING METHOD THEREOF

(75) Inventors: Benjamin James Stembridge, Needville, TX (US); Ryan Andrew Jurasek, S. Burlington, VT (US); Richard Michael Parent, Shelburne, VT (US)

(73) Assignee: Nanya Technology Corp., Tao-Yuan Hsien (TW)

( * ) Notice: Subject to any disclaimer, the term of this patent is extended or adjusted under 35 U.S.C. 154(b) by 59 days.

(21) Appl. No.: 12/573,486

(22) Filed: Oct. 5, 2009

(65) Prior Publication Data

US 2011/0080771 A1    Apr. 7, 2011

(51) Int. Cl.
G11C 11/24    (2006.01)
(52) U.S. Cl. .............. 365/149; 365/210.11; 365/222
(58) Field of Classification Search .......... 365/210.11
See application file for complete search history.

(56) References Cited

U.S. PATENT DOCUMENTS

| 6,525,972 | B2 * | 2/2003 | Yanagisawa | 365/189.09 |
| 6,901,012 | B2 * | 5/2005 | Ikehashi et al. | 365/189.15 |
| 7,266,031 | B2 * | 9/2007 | Kim et al. | 365/211 |
| 7,433,249 | B2 * | 10/2008 | Jung | 365/189.09 |

\* cited by examiner

Primary Examiner — Tan T. Nguyen
(74) Attorney, Agent, or Firm — Volpe & Koenig P.C.

(57) ABSTRACT

The configurations of a DRAM positive wordline voltage compensation device and a voltage compensating method thereof are provided in the present invention. The proposed device includes a comparator having a first input terminal receiving a positive wordline voltage feedback signal, a second input terminal receiving a compensating reference of array device threshold voltage and an output terminal generating a first enable signal, an oscillator receiving the first enable signal and generating an oscillating signal when the first enable signal is active and a charge pump having a first input terminal receiving a second enable signal, a second input terminal receiving the oscillating signal and an output terminal generating a positive wordline voltage being a sum of a bitline high voltage, an array device threshold voltage and a voltage margin.

17 Claims, 5 Drawing Sheets

DRAM POSITIVE WORDLINE VOLTAGE COMPENSATION DEVICE FOR ARRAY DEVICE THRESHOLD VOLTAGE AND VOLTAGE COMPENSATING METHOD THEREOF

FIELD OF THE INVENTION

The present invention relates to a DRAM positive wordline voltage compensation device and a voltage compensating method thereof. More particularly, it relates to a DRAM positive wordline voltage compensation device for array device threshold voltage and a voltage compensating method using charge sharing.

BACKGROUND OF THE INVENTION

In the current DRAM design, boosted voltages are used to turn the wordline on and off. The value of these voltages creates a tradeoff between performance and standby current consumption due to the gate induced drain leakage (GIDL) at the large number of wordline drivers (e.g., see FIGS. 1(a)-1(b), vpp and vnwl are the positive and negative wordline voltages respectively). In FIG. 1(a), the pre-driver is used to drive the DRAM cell (as shown in FIG. 1(c)) via the bwordline and wordline. Please refer to FIG. 1(d), Vt(V) varies according to the temperature and the process involved. For example, the Vt(V) under a high temperature and/or a fast process is relatively low and Vt(V) under a low temperature and/or a slow process is relatively high. The positive wordline voltage "vpp" must be set high enough for the memory cell as shown in FIG. 1(c) to function at worst case condition. This voltage margin leads to approximately 200 mV of overkill for conditions where the array threshold voltage Vt(V) is nominal or low (see FIG. 1(d)). For this condition, we are unnecessarily increasing standby current consumption. Using the case of 64K wordline pre-drivers on 8bank as an example, GIDL becomes non-negligible, and must be compensated.

In previous methods, only fixed positive and negative wordline voltage values are used. The positive and negative wordline voltage values are not changed to compensate for Vt(V) of the array device. FIG. 2(a) is a schematic circuit diagram of a conventional DRAM positive wordline voltage compensation device. In FIG. 2(a), the limiter is a comparator receiving a vpp feedback signal and a PVT (Vt(V)) insensitive reference and generating a first enable signal en, OSC is an oscillator receiving the first enable signal en and generating an oscillating signal when the first enable signal en is active (i.e. when the vpp feedback signal is less than the PVT insensitive reference), and the charge pump receives a second enable signal en and the oscillating signal and raises the vpp to a fixed level as shown in FIG. 2(b).

Keeping the drawbacks of the prior arts in mind, and employing experiments and research full-heartily and persistently, the applicant finally conceived a DRAM positive wordline voltage compensation device for array device threshold voltage and a voltage compensating method thereof.

SUMMARY OF THE INVENTION

It is therefore an object of the present invention to provide a DRAM positive wordline voltage compensation device for array device threshold voltage and a voltage compensating method thereof, which allows automatic adjustment of positive wordline voltage in order to compensate for the variation in threshold voltage of the array devices due to temperature and process variations so as to decrease GIDL leakage current and the standby leakage currents of the DRAM.

According to the first aspect of the present invention, a DRAM positive wordline voltage compensation device includes a limiter as a comparator with a first input terminal for receiving a positive wordline voltage feedback signal, a second input terminal for receiving a compensating reference of array device threshold voltage and an output terminal for generating a first enable signal, an oscillator for receiving the first enable signal and selectively generating an oscillating signal when the first enable signal is active and a charge pump having a first input terminal for receiving a second enable signal, a second input terminal for receiving the oscillating signal and an output terminal for generating a positive wordline voltage being a sum of a bitline high voltage, an array device threshold voltage and a voltage margin to compensate for a variation in the array device threshold voltage due to temperature and process variations.

Preferably, the device is disposed in a DRAM system having a plurality of wordline pre-drivers, each of which receives the positive wordline voltage, a DRAM cell circuit generating the positive wordline voltage feedback signal and a voltage divider for generating the compensating reference of array device threshold voltage, wherein the voltage margin is one of a value of zero and a value of less than 200 mV.

Preferably, the voltage divider has two resistors, both of which have the same resistance, an input terminal receives the bitline high voltage and an output terminal generates the compensating reference of array device threshold voltage being not larger than one half of the bit line high voltage, and the charge pump selectively raises the positive wordline voltage when the positive wordline voltage feedback signal is less than the compensating reference of array device threshold voltage.

Preferably, the DRAM cell circuit has a first DRAM cell sub-circuit with a first DRAM cell, a first refresh switch having a first and a second terminals and a first update switch having a first and a second terminals, a second DRAM cell sub-circuit with a second DRAM cell, a second refresh switch having a first and a second terminals and a second update switch having a first and a second terminals, and a storage capacitor with a first and a second terminals, the first terminal of the first refresh switch is grounded, the second terminal of the first refresh switch is coupled to the first DRAM cell and the first terminal of the first update switch, the second terminal of the first update switch is coupled to the first terminal of the storage capacitor and the second terminal of the second update switch, the second terminal of the storage capacitor is grounded, the first terminal of the second refresh switch receives the bit line high voltage, and the second terminal of the second refresh switch is coupled to the second DRAM cell and the first terminal of the second update switch.

Preferably, the first and the second DRAM cells have a first and a second wordlines respectively, the first and the second refresh switches are turned on and the first and second update switches are turned off in a refresh sequence such that a ground is written to the first DRAM cell and the bitline high voltage is written to the second DRAM cell when the first and the second wordlines are driven to the positive wordline voltage, the first and the second refresh switches and the first and second update switches are turned off when the first and the second wordlines are turned off in a second sequence, and the first and the second refresh switches are turned off and the first and second update switches are turned on in an access sequence such that a ground is selectively read from the first DRAM cell and the bitline high voltage is selectively read from the second DRAM cell when the first and the second wordlines are driven to the positive wordline voltage again, the refresh, the second and the access sequences occur iteratively and cause a charge sharing on the storage capacitor, and a voltage across the first and the second terminals of the storage capacitor is not larger than one half of the bitline high voltage.

Preferably, the written ground and the written bitline high voltage are respectively in a logic zero and a logic one states, and the read ground and the read bitline high voltage are respectively in the logic zero and the logic one states.

According to the second aspect of the present invention, a voltage compensation device comprises a first output terminal for generating a positive wordline voltage being a sum of a bitline high voltage, an array device threshold voltage and a voltage margin.

Preferably, the device further comprises a comparator having a first input terminal for receiving a positive wordline voltage feedback signal, a second input terminal for receiving a compensating reference of array device threshold voltage and a second output terminal for generating a first enable signal, an oscillator for receiving the first enable signal and selectively generating an oscillating signal when the first enable signal is active, and a charge pump having a first input terminal for receiving a second enable signal, a second input terminal for receiving the oscillating signal and the first output terminal, wherein the voltage compensation device is a DRAM positive wordline voltage compensation device.

According to the third aspect of the present invention, a voltage compensation device comprises a first output terminal for selectively raising a positive wordline voltage when the positive wordline voltage is less than a sum of a bitline high voltage, an array device threshold voltage and a voltage margin.

Preferably, the device further comprises a comparator having a first input terminal for receiving a positive wordline voltage feedback signal, a second input terminal for receiving a compensating reference of array device threshold voltage and a second output terminal for generating a first enable signal, an oscillator for receiving the first enable signal and selectively generating an oscillating signal when the first enable signal is active, and a charge pump having a first input terminal for receiving a second enable signal, a second input terminal for receiving the oscillating signal and the first output terminal, wherein the voltage compensation device is a DRAM positive wordline voltage compensation device.

According to the fourth aspect of the present invention, a voltage compensating method comprises a step of selectively raising a positive wordline voltage when the positive wordline voltage is less than a sum of a bitline high voltage, an array device threshold voltage and a voltage margin.

Preferably, the method is used for a DRAM positive wordline voltage compensation device disposed in a DRAM system having a first and a second wordlines, wherein the selectively raising step further comprises steps of: selectively writing the ground to the first DRAM cell and the bitline high voltage to the second DRAM cell when both of the first and the second wordlines are driven to the positive wordline voltage; selectively turning off the first and the second refresh switches and the first and second update switches when both of the first and the second wordlines are turned off; selectively reading the ground from the first DRAM cell and the bitline high voltage from the second DRAM cell when both of the first and the second wordlines are driven to the positive wordline voltage again; and selectively raising the positive wordline voltage when the positive wordline voltage feedback signal is less than the compensating reference of array device threshold voltage.

Preferably, the compensating reference of array device threshold voltage is not larger than one half of the bit line high voltage.

Preferably, the written ground and the written bitline high voltage are respectively in a logic zero and a logic one states, and the read ground and the read bitline high voltage are respectively in the logic zero and the logic one states.

Preferably, the voltage margin is one of a value of zero and a value of less than 200 mV.

According to the fifth aspect of the present invention, a voltage compensating method comprises a step of generating a positive wordline voltage being a sum of a bitline high voltage, an array device threshold voltage and a voltage margin.

Preferably, the method is used for a DRAM positive wordline voltage compensation device disposed in a DRAM system having a first and a second wordlines.

The present invention may best be understood through the following descriptions with reference to the accompanying drawings, in which:

DETAILED DESCRIPTION OF THE PREFERRED EMBODIMENT

Figure 2A:
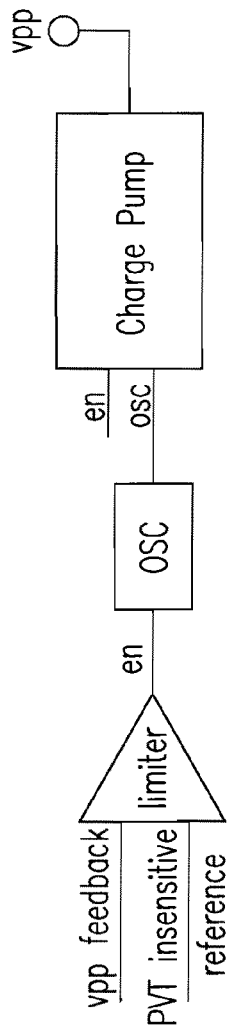
FIG. 2(a) shows a schematic circuit diagram of a DRAM positive wordline voltage compensation device in the prior art.
Figure 2B:
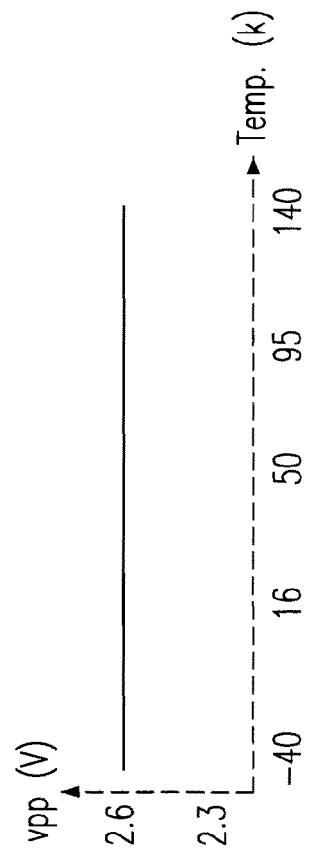
FIG. 2(b) shows a waveform diagram of pvv versus temperature according to FIG. 2(a)
Figure 3A:
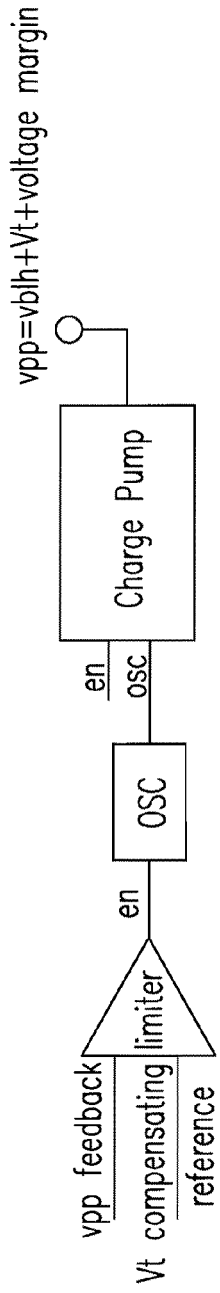
FIG. 3(a) shows a schematic circuit diagram of a main circuit of DRAM positive wordline voltage compensation device according to the preferred embodiment of the present invention.
Figure 3B:
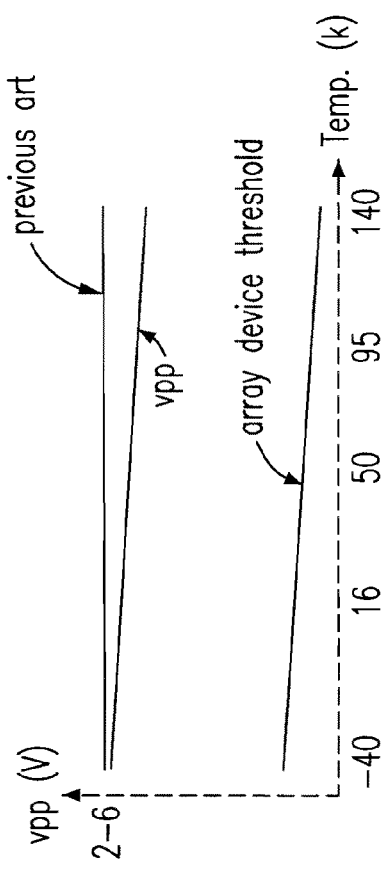
FIG. 3(b) shows a waveform diagram of the vpp and the array device threshold voltage versus temperature according to FIG. 3(a), as well as the fixed valued vpp of the previous art versus the temperature.

FIG. 3(a) shows a schematic circuit diagram of a main circuit of DRAM positive wordline voltage compensation device according to the present preferred embodiment. The differences between FIG. 3(a) and FIG. 2(a) are that the second input terminal of the limiter receiving a Vt compensating reference instead of the PVT insensitive reference as shown in FIG. 2(a), and vpp=the bitline high voltage vblh+ the array device threshold voltage Vt+a voltage margin value, which could be either zero or a value of less than 200 mV, instead of the fixed valued vpp as shown in FIG. 2(a). FIG. 3(b) shows a waveform diagram of the vpp and the array device threshold voltage versus temperature according to FIG. 3(a), and the fixed valued vpp of the previous art versus the temperature.

The idea is that a Vt compensated reference is used to adjust the positive wordline voltage. This allows the positive wordline voltage to be reduced since variations on the array device threshold voltage Vt are accounted for. Previous arts simply made the positive wordline voltage sufficiently high to handle the worst case and took a GIDL hit during nominal Vt operation.

Figure 1A:
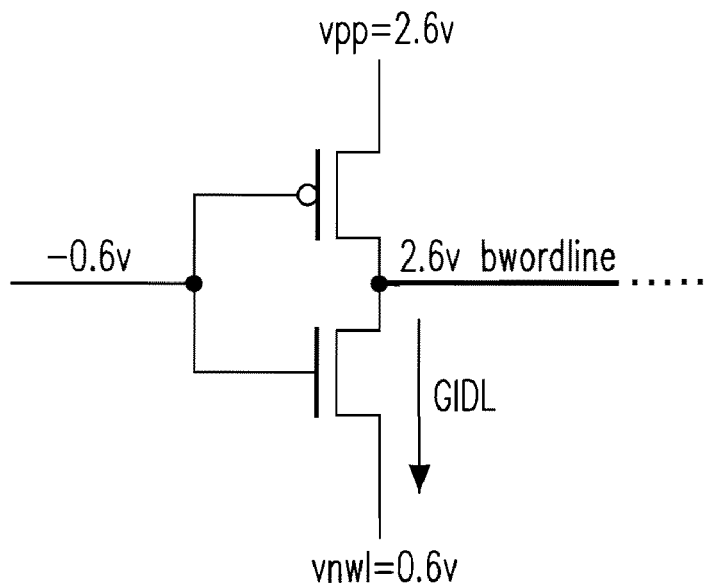
FIG. 1(a) shows a circuit diagram of a pre-driver used to drive DRAM cells of a DRAM system in the prior art.
Figure 1B:
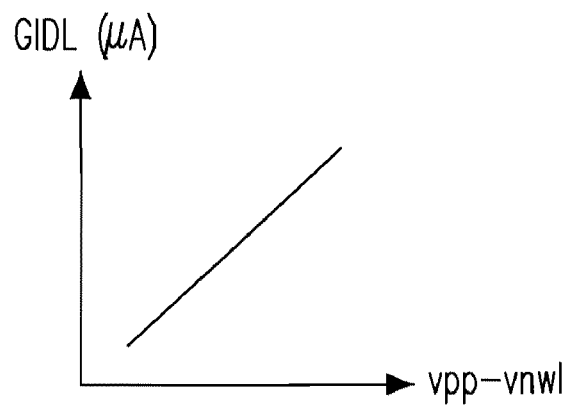
FIG. 1(b) shows a waveform diagram of GIDL versus vpp-vnwl according to FIG. 1(a)
Figure 1C:
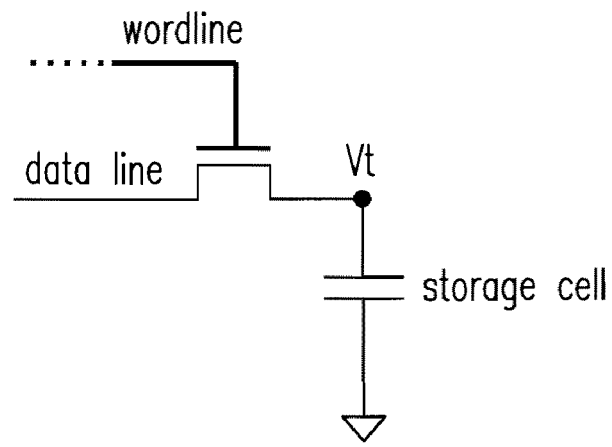
FIG. 1(c) shows a circuit diagram of a DRAM cell of a DRAM system in the prior art.
Figure 1D:
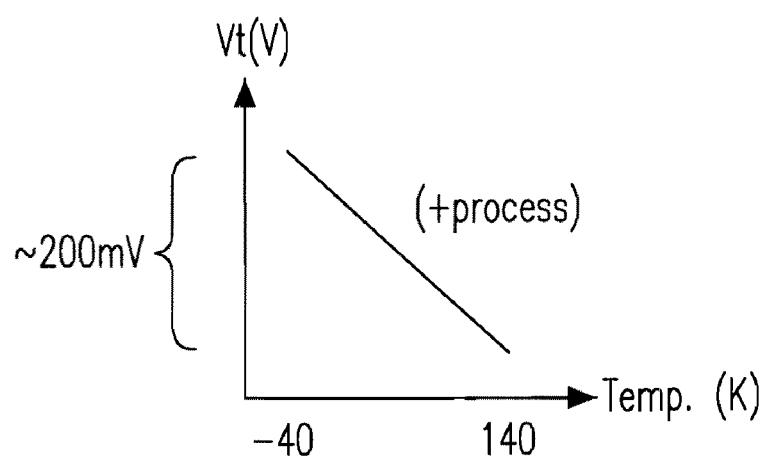
FIG. 1(d) shows a waveform diagram of Vt(V) versus temperature according to FIG. 1(c)
Figure 4:
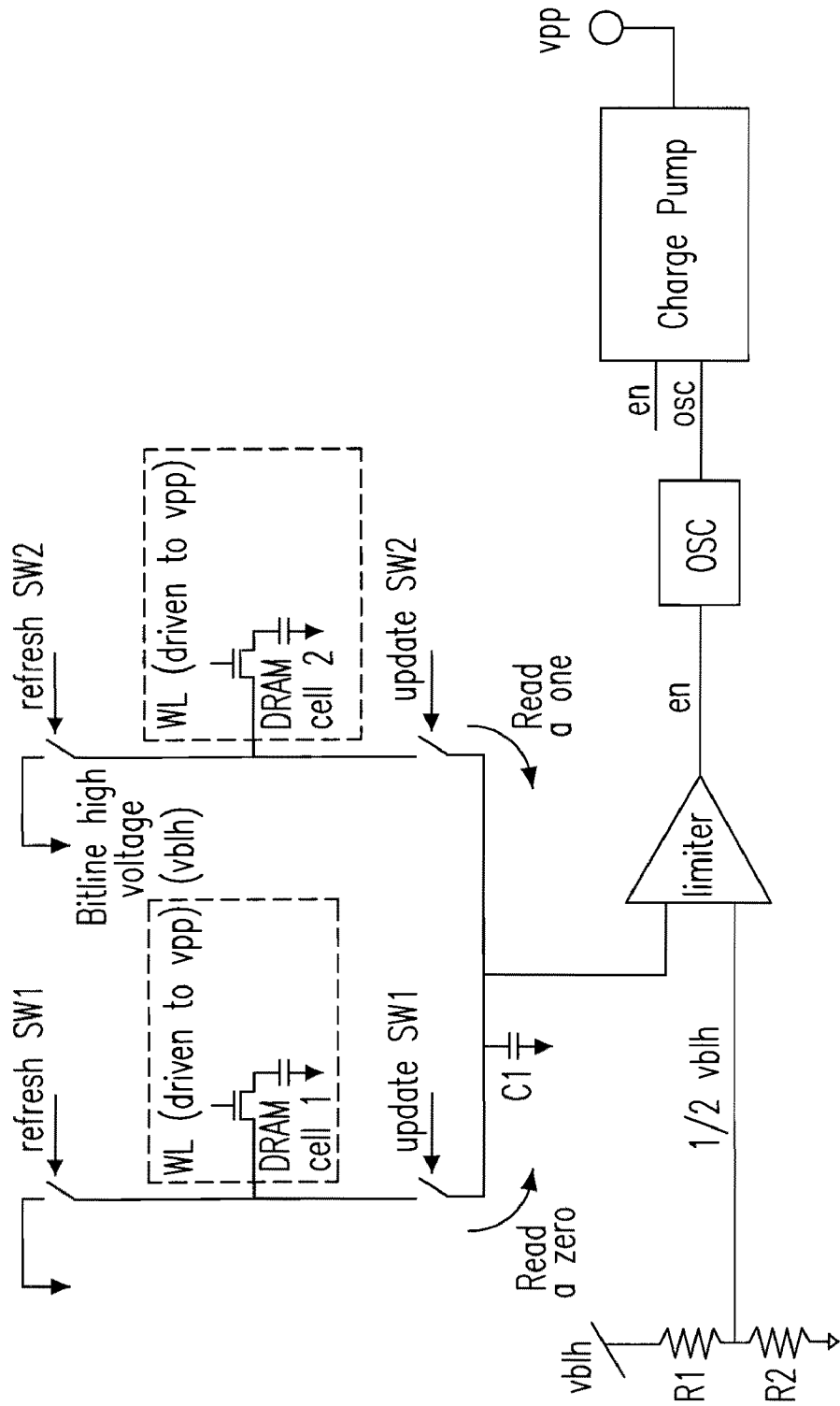
FIG. 4 shows a schematic circuit diagram of a DRAM positive wordline voltage compensation device according to the preferred embodiment of the present invention.

FIG. 4 shows a schematic circuit diagram of a DRAM positive wordline voltage compensation device according to the present preferred embodiment. The proposed positive wordline voltage compensation device is disposed in a DRAM system having a plurality of wordline pre-drivers (not shown in FIG. 4), each of which receives the positive wordline voltage (e.g., see FIG. 1(a)), a DRAM cell circuit generating the positive wordline voltage feedback signal and a voltage divider generating the compensating reference of array device threshold voltage.

In FIG. 4, the DRAM cell circuit has a first DRAM cell sub-circuit with a first DRAM cell DRAM cell 1, a first refresh switch having a first and a second terminals refresh SW1 and a first update switch having a first and a second terminals update SW1, a second DRAM cell sub-circuit with a second DRAM cell DRAM cell 2, a second refresh switch having a first and a second terminals refresh SW2 and a second update switch having a first and a second terminals update SW2, and a storage capacitor with a first and a second terminals C1, the first terminal of the first refresh switch refresh SW1 is grounded, the second terminal of the first refresh switch refresh SW1 is coupled to the first DRAM cell DRAM cell 1 and the first terminal of the first update switch update SW1, the second terminal of the first update switch update SW1 is coupled to the first terminal of the storage capacitor C1 and the second terminal of the second update switch update SW2, the second terminal of the storage capacitor C1 is grounded, the first terminal of the second refresh switch refresh SW2 receives the bit line high voltage (vblh), and the second terminal of the second refresh switch refresh SW2 is coupled to the second DRAM cell and the first terminal of the second update switch update SW2. Except for the DRAM cell circuit, the other difference between FIG. 4 and FIG. 3 is that a voltage divider having two resistors R1 and R1 electrically connecting to each other in series, both of which have the same resistance, receiving the bitline high voltage vblh and providing the Vt compensating reference ($\leq\frac{1}{2}$ vblh) to the second input terminal of the limiter as shown in FIG. 4.

Please refer to FIG. 4, the first and the second DRAM cells have a first and a second wordlines respectively, the first and the second refresh switches refresh SW1 and refresh SW2 are turned on and the first and second update switches update SW1 and update SW2 are turned off in a refresh sequence such that a ground is written to the first DRAM cell DRAM cell 1 and the bitline high voltage vblh is written to the second DRAM cell DRAM cell 2 when the first and the second wordlines are driven to the positive wordline voltage vpp, the first and the second refresh switches refresh SW1 and refresh SW2 and the first and second update switches update SW1 and update SW2 are turned off when the first and the second wordlines are turned off in a second sequence, and the first and the second refresh switches refresh SW1 and refresh SW2 are turned off and the first and second update switches update SW1 and update SW2 are turned on in an access sequence such that a ground is read from the first DRAM cell and the bitline high voltage is read from the second DRAM cell when the first and the second wordlines are driven to the positive wordline voltage vpp again, the refresh, the second and the access sequences occur iteratively and cause a charge sharing on the storage capacitor C1, and a voltage across the first and the second terminals of the storage capacitor is not larger than one half of the bitline high voltage ($\frac{1}{2}$ vblh). The written ground and the written bitline high voltage are respectively in a logic zero and a logic one states, and the read ground and the read bitline high voltage are respectively in the logic zero and the logic one states.

If the vpp level is high enough, the charge sharing should be $\frac{1}{2}$ of the bitline high voltage (vblh), so the comparator is used to compare whether it is $\frac{1}{2}$ the bitline voltage (vblh), the charge pump can be used to raise vpp if it isn't. The $\frac{1}{2}$ value comparison can be put slightly lower to prevent a pump forever condition in which there may be loss at any value of vpp, therefore, it is impossible to charge share to exactly $\frac{1}{2}$ vblh.

According to the aforementioned descriptions, the present preferred embodiment provides a DRAM positive wordline voltage compensation device for array device threshold voltage and an implementation method thereof, which allows automatic adjustment of positive wordline voltage in order to compensate for the variation in threshold voltage of the array devices due to temperature and process variations so as to decrease GIDL leakage current and the standby leakage currents of the DRAM, which indeed possesses the non-obviousness and the novelty.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present invention which is defined by the appended claims.

What is claimed is:

1. A DRAM positive wordline voltage compensation device, comprising:
   a comparator having a first input terminal for receiving a positive wordline voltage feedback signal, a second input terminal for receiving a compensating reference of array device threshold voltage and an output terminal for generating a first enable signal;
   an oscillator for receiving the first enable signal and selectively generating an oscillating signal when the first enable signal is active; and
   a charge pump having a first input terminal for receiving a second enable signal, a second input terminal for receiving the oscillating signal and an output terminal for generating a positive wordline voltage being a sum of a bitline high voltage, an array device threshold voltage and a voltage margin to compensate for a variation in the array device threshold voltage due to temperature and process variations.

2. A device according to claim 1 being disposed in a DRAM system having a plurality of wordline pre-drivers, each of which receives the positive wordline voltage, a DRAM cell circuit for generating the positive wordline voltage feedback signal and a voltage divider for generating the compensating reference of array device threshold voltage, wherein the voltage margin is one of a value of zero and a value of less than 200 mV.

3. A device according to claim 2, wherein the voltage divider has two resistors, both of which have the same resistance, an input terminal receives the bitline high voltage and an output terminal generates the compensating reference of array device threshold voltage being not larger than one half of the bit line high voltage, and the charge pump selectively raises the positive wordline voltage when the positive wordline voltage feedback signal is less than the compensating reference of array device threshold voltage.

4. A device according to claim 2, wherein the DRAM cell circuit has a first DRAM cell sub-circuit with a first DRAM cell, a first refresh switch having a first and a second terminals and a first update switch having a first and a second terminals, a second DRAM cell sub-circuit with a second DRAM cell, a second refresh switch having a first and a second terminals and a second update switch having a first and a second terminals, and a storage capacitor with a first and a second terminals, the first terminal of the first refresh switch is grounded, the second terminal of the first refresh switch is coupled to the first DRAM cell and the first terminal of the first update switch, the second terminal of the first update switch is coupled to the first terminal of the storage capacitor and the second terminal of the second update switch, the second terminal of the storage capacitor is grounded, the first terminal of the second refresh switch receives the bit line high voltage, and the second terminal of the second refresh switch is coupled to the second DRAM cell and the first terminal of the second update switch.

5. A device according to claim 4, wherein the first and the second DRAM cells have a first and a second wordlines respectively, the first and the second refresh switches are turned on and the first and second update switches are turned off in a refresh sequence such that a ground is written to the first DRAM cell and the bitline high voltage is written to the second DRAM cell when the first and the second wordlines are driven to the positive wordline voltage, the first and the second refresh switches and the first and second update switches are turned off when the first and the second wordlines are turned off in a second sequence, and the first and the second refresh switches are turned off and the first and second update switches are turned on in an access sequence such that a ground is selectively read from the first DRAM cell and the bitline high voltage is selectively read from the second DRAM cell when the first and the second wordlines are driven to the positive wordline voltage again, the refresh, the second and the access sequences occur iteratively and cause a charge sharing on the storage capacitor, and a voltage across the first and the second terminals of the storage capacitor is not larger than one half of the bitline high voltage.

6. A device according to claim 5, wherein the written ground and the written bitline high voltage are respectively in a logic zero and a logic one states, and the read ground and the read bitline high voltage are respectively in the logic zero and the logic one states.

7. A voltage compensating method comprising: selectively raising a positive wordline voltage when the positive wordline voltage is less than a sum of a bitline high voltage, an array device threshold voltage and a voltage margin being used for a DRAM positive wordline voltage compensation device disposed in a DRAM system having a first and a second wordlines as claimed in claim 5, wherein the selectively raising step further comprises steps of:
selectively writing the ground to the first DRAM cell and the bitline high voltage to the second DRAM cell when both of the first and the second wordlines are driven to the positive wordline voltage;
selectively turning off the first and the second refresh switches and the first and second update switches when both of the first and the second wordlines are turned off;
selectively reading the ground from the first DRAM cell and the bitline high voltage from the second DRAM cell when both of the first and the second wordlines are driven to the positive wordline voltage again; and
selectively raising the positive wordline voltage when the positive wordline voltage feedback signal is less than the compensating reference of array device threshold voltage.

8. A voltage compensating method according to claim 7, wherein the compensating reference of array device threshold voltage is not larger than one half of the bit line high voltage.

9. A voltage compensating method according to claim 7, wherein the written ground and the written bitline high voltage are respectively in a logic zero and a logic one states, and the read ground and the read bitline high voltage are respectively in the logic zero and the logic one states.

10. A voltage compensating method according to claim 7, wherein the voltage margin is one of a value of zero and a value of less than 200 mV.

11. A voltage compensation device comprising a charge pump having a first output terminal for generating a positive wordline voltage being a sum of a bitline high voltage, an array device threshold voltage and a voltage margin.

12. A device according to claim 11 further comprising a comparator having a first input terminal for receiving a positive wordline voltage feedback signal, a second input terminal for receiving a compensating reference of array device threshold voltage and a second output terminal for generating a first enable signal, an oscillator for receiving the first enable signal and selectively generating an oscillating signal when the first enable signal is active, and a charge pump having a first input terminal for receiving a second enable signal, a second input terminal for receiving the oscillating signal and the first output terminal, wherein the voltage compensation device is a DRAM positive wordline voltage compensation device.

13. A voltage compensation device comprising a charge pump having a first output terminal for selectively raising a positive wordline voltage when the positive wordline voltage is less than a sum of a bitline high voltage, an array device threshold voltage and a voltage margin.

14. A device according to claim 13 further comprising a comparator having a first input terminal for receiving a positive wordline voltage feedback signal, a second input terminal for receiving a compensating reference of array device threshold voltage and a second output terminal for generating a first enable signal, an oscillator for receiving the first enable signal and selectively generating an oscillating signal when the first enable signal is active, and a charge pump having a first input terminal for receiving a second enable signal, a second input terminal for receiving the oscillating signal and the first output terminal, wherein the voltage compensation device is a DRAM positive wordline voltage compensation device.

15. A voltage compensating method comprising a step of providing a charge pump that selectively raising a positive wordline voltage when the positive wordline voltage is less than a sum of a bitline high voltage, an array device threshold voltage and a voltage margin.

16. A voltage compensating method comprising a step of providing a charge pump that generating a positive wordline voltage being a sum of a bitline high voltage, an array device threshold voltage and a voltage margin.

17. A voltage compensating method according to claim 16, wherein the method is used for a DRAM positive wordline voltage compensation device disposed in a DRAM system having a first and a second wordlines.

* * * * *